United States Patent [19]

Gani et al.

[11] 4,129,790
[45] Dec. 12, 1978

[54] HIGH DENSITY INTEGRATED LOGIC CIRCUIT

[75] Inventors: Venkappa L. Gani; Frank A. Montegari, both of Wappingers Falls, N.Y.

[73] Assignee: International Business Machines Corporation, Armonk, N.Y.

[21] Appl. No.: 862,704

[22] Filed: Dec. 21, 1977

[51] Int. Cl.² .................... H03K 19/08; H03K 19/12; H03K 19/20

[52] U.S. Cl. ............................... 307/203; 307/200 A; 307/208; 307/213; 307/218; 307/317 A

[58] Field of Search ................ 307/203, 208, 200 A, 307/213, 214, 215, 218, 317 A

[56] References Cited

U.S. PATENT DOCUMENTS

| | | | |
|---|---|---|---|
| 3,418,492 | 12/1968 | Lin | 307/218 X |
| 3,769,524 | 10/1973 | Mathews | 307/317 A X |
| 3,942,033 | 3/1976 | Swiatowiec | 307/215 |
| 3,962,590 | 6/1976 | Kane et al. | 307/213 X |
| 4,032,796 | 6/1977 | Fulkerson | 307/218 |
| 4,071,774 | 1/1978 | Tokumara et al. | 307/215 |

OTHER PUBLICATIONS

Gruodis et al., "High-Density, Transistor Logic Circuit"; *IBM Tech. Discl. Bull.*; vol. 18, No. 11, pp. 3654–3655, 4/1976.
Chen et al., "Off-Chip Ground-Up Receiver"; *IBM Tech. Discl. Bull.*, vol. 20, No. 2, pp. 613–614; 7/1977.
Chen et al., "Schottky Transistor Logic Macro Receive Cell"; *IBM Tech. Discl. Bull.*, vol. 20, No. 2, pp. 608–610; 7/1977.

*Primary Examiner*—Larry N. Anagnos
*Attorney, Agent, or Firm*—Theodore E. Galanthay

[57] ABSTRACT

The disclosed logic circuit includes one transistor and a plurality of Schottky barrier diodes in each logic circuit "cell," a plurality of such cells being interconnected to perform desired logic functions. Cell interconnections are made by interconnecting metallurgy which can have a relatively high resistance with relatively long interconnecting paths between a sending circuit cell and a receiving circuit cell. The undesirable effects of this metallurgy resistance are overcome by driving the base of the receiving transistor through a base drive resistor in the sending cell.

9 Claims, 4 Drawing Figures

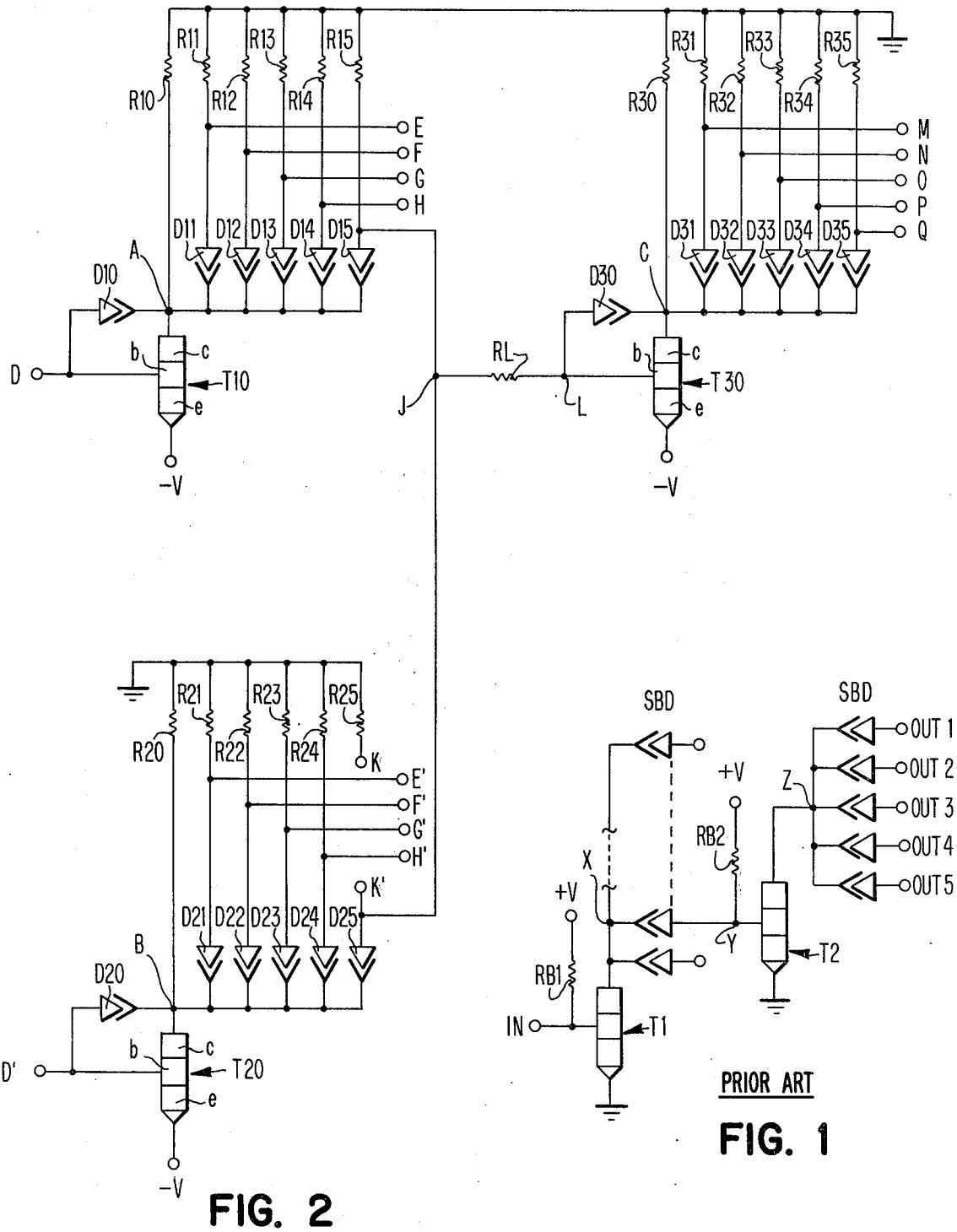

HIGH DENSITY INTEGRATED LOGIC CIRCUIT

CROSS-REFERENCE TO RELATED PUBLICATIONS

1. Chin et al. "Injection Logic Gate," IBM TDB Vol. 19, No. 9, February, 1977, Page 3373-3374.
2. Eichelberger et al. "Monolithic Diode — Transistor Logic Circuitry," IBM TDB Vol. 19, No. 9, February, 1977, Page 3431-3432.
3. Chen et al. "Schottky Transistor Logic Base Extension Cell," IBM TDB Vol. 20, No. 1, June, 1977, Pages 182-183.
4. Chen et al. "Off-Chip Ground-Up Receiver," IBM TDB Vol. 20, No. 2, July, 1977, Pages 613-614.
5. Peltier "A New Approach to Bipolar LSI:$C^3L$," IEEE International Solid-State Circuits Conference, 1975, Pages 168-169.
6. "The New LSI; Part 2 Injection Logic's Range of Applications is Widest," ELECTRONICS, July 10, 1975, Pages 86-89.

BACKGROUND OF THE INVENTION

1. Field of the Invention

This invention relates to integrated logic circuits and more particularly to integrated logic circuits employing Schottky barrier diodes and transistors, sometimes referred to as Schottky transistor logic (STL). 2. Description of the Prior Art The hereinabove listed publications describe the state of the prior art and the advantages of Schottky transistor logic (STL) circuits in general. STL circuits are relatively simple to fabricate in a dense integrated circuit configuration since multiple fan-out is provided by the formation of a plurality of Schottky diodes into the collector region of a transistor. Process improvements permitting the fabrication of low forward voltage drop Schottky barrier diodes (SBD's) in the order of 280 millivolts at 0.1 milliamps provides the desirable combination of high speed and lower power consumption.

A typical prior art circuit showing two cells in an STL configuration is illustrated in FIG. 1. An input signal at the input terminal (IN) either steers current away from the base of T1 or permits current drive from supply +V through base drive resistor RB1. The collector of T1 provides an output at node X which then, through one of the plurality of illustrated SBD's affects the input point of the succeeding stages such as the illustrated node Y. Base drive resistor RB2 provides base drive to transistor T2 unless the current is steered away by a down level potential at node X occasioned by transistor T1 being on. In this latter case, transistor T2 would be held off keeping node Z at an up level so that the output terminals 1-5 would not steer any current away from any further input nodes to which they in turn are connected.

A problem not addressed or solved by the known prior art arises when node X and node Y are spaced apart on an integrated circuit chip giving rise to a metallurgy resistance in the order of 12 ohms to 120 ohms or even more. This is significant when compared with the value of base drive resistance for the resistors RB1 and RB2 which are usually in the order of 2,000 - 8,000 ohms. In the case where transistor T1 is on, the voltage drop between node Y and ground potential must include not only the diode drop of the Schottky barrier diode and the voltage drop through transistor T1 but further take into consideration the metallurgy resistance, these last three mentioned elements forming a voltage divider with base drive resistor RB2 at node Y. This results in a relatively high down level at receiving nodes such as node Y, degrading the noise tolerance of the overall logic network.

SUMMARY OF THE INVENTION

Accordingly, it is a primary object of the present invention to overcome the adverse effects of high resistance interconnections.

It is another object of this invention to provide an improved integrated logic circuit incorporating Schottky transistor logic.

Lastly, it is an object of this invention to provide a very dense integrated logic circuit with high performance, low power dissipation, and high tolerance to noise.

In accordance with the foregoing, the adverse affects of high resistance metallurgy in Schottky transistor logic are overcome by a circuit design which provides current drive to the base of a receiving transistor at the sending circuit rather than at the receiving circuit. This avoids the undesirable voltage divider effect at the base of the receiving circuit as described with respect to the noted prior art.

Briefly, each logic cell includes a plurality of series connected resistors and Schottky barrier diodes connected in electrical parallel with each other and in electrical series with a transistor having collector, base, annd emitter regions, the collector region of the transistor being connected to the first plurality of diodes and the base region being connected to a first input terminal. The emitter region of the transistor is connected to a first source of potential while the plurality of resistors are connected to the second source of potential. The outputs of each cell are taken from each of the points between the plurality of resistors and diodes. Each of these series connected resistors then provide a current drive to the base of the transistor in the next stage. In this current path, the metallurgy resistance becomes negligible as it is in series with the base drive resistance between the second potential source and the base of the receiving transistor. In the opposite logic state, when the sending transistor is "on" so that current is steered away from the base of the receiving transistor, the base drive resistor does not form a voltage divider at the base of the receiving transistor.

The foregoing and other objects, features, and advantages of the invention will be apparent from the following and more particular description of the preferred embodiments of the invention as illustrated in the accompanying drawings.

IN THE DRAWINGS

FIG. 1 is a circuit diagram illustrating the prior art.

FIG. 2 is a circuit diagram illustrating one embodiment of the present invention.

DETAILED DESCRIPTION

Figure 3A:
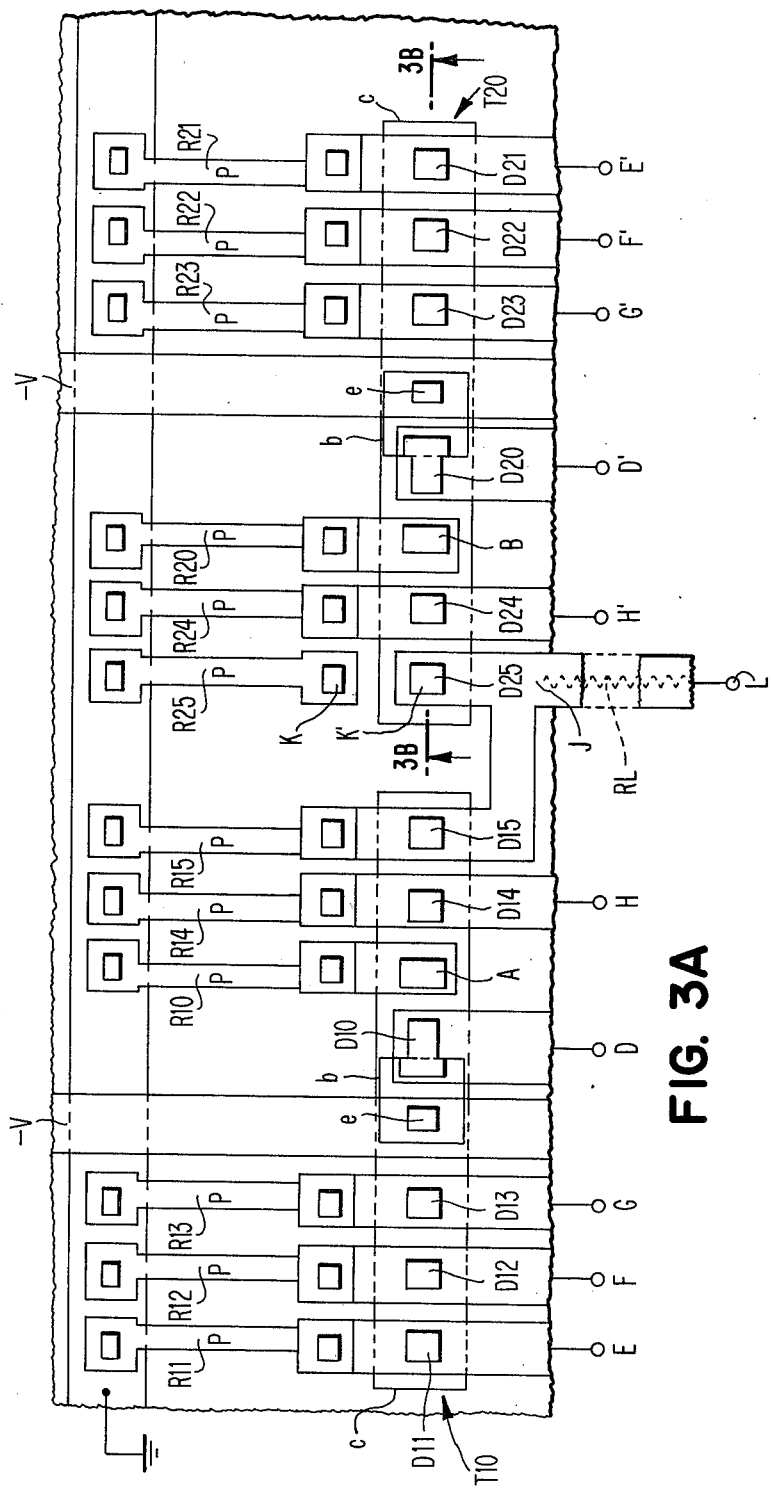
FIG. 3A is a top view of the invention in integrated circuit form.

Refer now to FIG. 2 for a detailed description of one embodiment of the present invention. The circuit diagram illustrates three cells. The first cell includes the NPN transistor T10 having collector (c), base (b), and emitter (e) regions. The emitter region is connected to a first source of potential −V. The base is connected to a first input terminal D and the collector is connected to a second source of potential (ground) through ohmic collector contact A and by means of load resistance R10. Transistor T10 is shown with a base to collector Schottky diode D10 which is a high forward voltage drop diode and provides clamping to prevent saturation of transistor T10. Resistor R11 and Schottky barrier diode D11 are connected in electrical series with each other and in parallel with load resistor R10 between ground potential and the collector of transistor T10. A point between R11 and D11 provides a first output point at terminal E for this first cell. For the purposes of this example, a fan-out of five is provided so that an additional plurality of resistors including R12, R13, R14, and R15 are connected in series respectively with Schottky barrier diodes D12, D13, D14, and D15, each of these series connected resistors and diodes being in electrical parallel with load resistor R10. A point between resistor R12 and SBD D12 provides an output at terminal F. Similarly, points between resistor R13 and SBD D13, R14 and D14, and R15 and D15 provide outputs at terminal G, terminal H, and node J, respectively.

A second cell similar to the just described cell is connected in electrical parallel with the first cell and, for purposes of illustration includes transistor T20 having collector (c), base (b), and emitter (e) regions and further including the same number of associated resistors and Schottky barrier diodes. T20 receives an input at its base from a second input terminal D'. The collector base clamp for T20 is provided by Schottky barrier diode D20. The load resistance for T20 connected between ground potential and the collector contact B at the collector of T20 is provided by resistor R20. Resistor R21 is connected in electrical series with SBD D21 between ground potential and the collector of T20. Connected in series with each other but in electrical parallel with R21 and D21 are resistor R22 and SBD D22, resistor R23 and SBD D23, and resistor R24 and SBD D24. A point between R21 and D21 provides an output terminal E'. The point between R22 and D22 provides an output at terminal F'; the point between R23 and D23 provides an output at G'; while the point between R24 and D24 provides an output at terminal H'.

At this point it is noted that resistor R25 is connected to ground potential while Schottky barrier diode D25 is connected to the collector of T20 but R25 and D25 are not connected to each other. This selective disconnection of R25 and D25 at terminals K and K' is one of the features of the present invention. It is noted that in this configuration, D25 and D15 share resistor R15. Since R15 and R25 have the same value of resistance, obviously R15 could have been disconnected instead of R25. In this same manner, all of the output terminals E-H and E'-H' which are dotted with other cells would have one of the associated resistors disconnected in the illustrated manner.

What has been described is a collector dot fan-in of two sending cells into node J. Additional fan-in is possible in the same way so long as the connection between the resistor and diode is severed in all cases except for one as illustrated by resistor R15. The just described two cells will be referred to as sending cells. Obviously, this is a relative term in that each of these two cells is a receiving cell with respect to cells having their outputs connected to terminals D and D'. They are referred to as sending cells relative to the third cell in FIG. 2 which will be referred to as the receiving cell. While the two sending cells are placed very close to each other on the integrated circuit chip, the receiving cell may be some distance away connected by metallurgy with a finite resistance identified as RL. At the far end of the metallurgy RL is node L which is the input terminal to the receiving cell.

The receiving cell is similar in structure to the previously described sending cells and includes transistor T30 having collector (c), base (b), and emitter (e) regions. The emitter region is connected to the same first potential source −V as are the emitters of T10 and T20. The base of T30 is connected to the input node L while the collector of T30 is connected to ground potential through its associated load resistor R30 and ohmic collector contact C.

Anti-saturtion clamping for transistor T30 is provided by Schottky barrier diode D30. Resistor R31 is connected in series with Schottky barrier diode D31 between ground and the collector of T30 in parallel with RBO. A point between R31 and D31 provides an output to the next cell at terminal M. Additional resistor/Schottky barrier diode series connections are illustrated by R32 and D32, R33 and D33, R34 and D34, and R35 and D35. Each of these last mentioned resistor-diode series paths have an output point therebetween providing an output at terminals, N, O, P, and Q, respectively. Again, a fan-out of five is illustrated although this is entirely arbitrary. A feature, however, is that the circuit has the capacity for a large fan-out as well as a large fan-in without impairing circuit operation.

It should be noted that Schottky barrier diodes D10, D20, and D30 are of conventional design having a high forward diode drop in the order of 600 millivolts at 0.1 milliamps. This is consistent with the conventional construction of NPN transistors T10, T20, and T30 to provide the suitable anti-saturation base to collector clamping.

On the other hand, the remaining diodes illustrated in FIG. 2 are preferably low forward diode drop Schottky barrier diodes having a forward drop in the order of 280 millivolts at 0.1 milliamps. The low forward drop SBD's at the collector DOT connections is a feature of Schottky transistor logic. The collector load resistors R10, R20, and R30 typically have a resistance value similar to the base drive resistors and are in the order of 2,000 − 8,000 ohms. Each of the base drive resistors R11-R15 and R21-R25 potentially provide base drive to the transistor T30 (or its counterpart) in a succeeding receiver stage. Similarly, base drive resistors R31-R35 provide base drive to the next succeeding receiver stage. The metallurgy resistance RL will vary widely depending on many factors such as the distance between the receiver and sender cells, the resistivity of the line, etc. A significant feature of the present circuit is that it is relatively insensitive to variations and large values of metallurgy resistance RL providing required flexibility for the design of large scale integrated (LSI) circuits. In the illustrated example, base drive for T30 comes from resistor R15. It is noted again that only one of the base drive resistors in a preceeding stage is connected in the case of multiple fan-ins in order to provide the correct amount of base drive to T30 (or its counterpart in similar receiver circuits). With the aforementioned exemplary values that have been given, −V is in the order of −1.5 volts.

Refer now to FIG. 3A which is a top view schematic representation of a portion of an integrated circuit chip. Particularly illustrated are the layout for the two sending cells illustrated in FIG. 2. Transistor T10 is on the left side of the drawing and has an elongated collector region (c) formed from N-type epitaxial silicon. Low forward voltage drop Schottky barrier diodes D11–D15 are formed into this collector region. Also formed into the collector region is a P-type base (b) and an ohmic collector contact A for resistor R10. Resistor R10 as well as resistors R11–R15 are formed by P-type diffusions (or ion implants) as a standard P-type resistor well known in the art. These resistors R10–R15 are connected at their upper end to the ground distribution bus which is formed with first level metal. First level metal also extends from the Schottky barrier diodes D11–D15 downwardly to the next cell and terminals E, F, G, and H have been identified in conformance with FIG. 2. First level metal also provides the input to the cell from terminal D to the base of transistor T10. The emitter (e) is formed by an N+ type dopant into the base region. After oxidation, a via hole is opened to permit the −V potential line to contact the emitter. The −V potential line is formed from second level metal. The base contact and high forward voltage drop SBD D10 are illustrated as being partially over the collector region and partially over the base region of T10.

The second sending cell is illustrated on the right side of the drawing and is substantially similar to the first sending cell. Transistor T20 has an elongated collector region C including the low forward voltage drop Schottky barrier diodes T21–T25. P-type resistors R21–R25 are located in parallel between the various low forward voltage drop SBDs and the ground potential bus. At this point, a distinction becomes apparent. Particularly, note the discontinuity at terminals K and K′ where the metallization extending to Schottky barrier diode D25 has not been extended to also make contact with resistor R25. By the simple technique of metallizing at the first level metallization stage only to the diode D25 and not all the way to the resistor contact K, the circuit configuration desired in the diagram of FIG. 2 is readily realized. The Schottky barrier diodes D15 and D25 are connected together by the metallization forming common node J. This metallization then extends to the input node L of a receiving cell. On a large scale integrated (LSI) chip that may be 300 mils on a side, the distance between terminal L and node J can be quite far, particularly when one considers that the metallization lines are not always straight lines but follow tortuous paths. Severe wiring and layout limitations occur if the distance between terminal L and node J must be restricted. As previously mentioned, the circuit of the present invention permits the desired layout flexibility by overcoming the disadvantages of the unavoidable resistance RL.

As is the case for the first sending cell in FIG. 3A, the second sending cell further includes the base diffusion (b) of transistor T20, and the emitter diffusion (e) formed therein. A collector contact B permits R20 to be connected between the collector of T20 and the ground bus. Second level metal connects the −V potential to the emitter of D20. The high forward voltage drop Schottky barrier diode D20 overlies part of the base and part of the collector region and is connected to the first level metal contact forming the input terminal D′. The various resistors R10–R15 and R20–R25 are standard P-type resistors known to be fabricatable having values of 2,000 to 8,000 ohms, as desired.

Figure 3B:
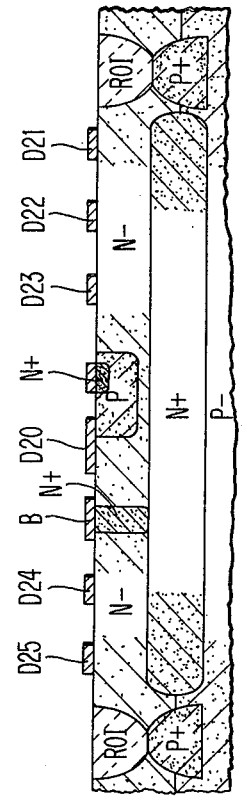
FIG. 3B is a cross section of the invention in integrated circuit form along section line AA in FIG. 3A.

Refer now to FIG. 3B which illustrates a cross section along section line AA of FIG. 3A. Initially, a P-type substrate having an N+ type subcollector therein is covered by an N-type epitaxial layer. Islands are isolated by any desired technique. Illustrated is a recessed oxide isolated (ROI) device in which a P+ type insolation under ROI completes the isolation of the island. The N+ subcollector is formed in its known manner and an N+ diffusion extends down to the subcollector for the ohmic collector contact B for resistor R20. Schottky barrier diodes D21, D22, D23, D24, and D25 are formed directly on the N− epitaxial region by metals such as tantalum-chrome or titanium-tungsten. The P base is formed into the N epi and the N+ emitter is formed into the P-type base region. The high forward voltage drop Schottky diode D20 is formed into the N epi and extended over the P-type base region to also form a base cntact.

Those skilled in the integrated circuit and semiconductor fabrication art will recognize the various desired sequence of process steps and processing techniques which can be applied to the fabrication of the present invention. What is here emphasized is the relatively simple manner in which the circuit of FIG. 2 can be implemented. The shortening of the first level metallization at terminal K′ requires no trade-off whatsoever while assuring that the correct base drive is supplied to the receiving stage obtaining its input from terminal L.

OPERATION

The circuit of FIG. 2 is connected in an exemplary manner to provide a logic function in the same way as known STL circuits. The utilization of this circuit does not differ from the prior art, rather the power/performance improvements and insensitivity to noise even in the case of high interconnecting metallurgy resistances have been recited as improvements.

When the input at either node D or node D′ is at an up level, node J is brought to a down level, turning transistor T30 off. This causes output terminals M, N, O, P, and Q to be at an up level. Conversely, when D and D′ are both at down levels, node J will at an up level turning T30 on and bringing terminals M, N, O, P, and Q to a down level. Thus, the entire circuit of FIG. 2 provides the function of an OR logic circuit.

On the other hand, if a NOR function is desired, then the logic inputs at terminals D and D′ provide a NOR circuit output at node J. Thus, when any of the inputs at D or D′ are at an up level, node J will be at a down level. All of the terminals D and D′ must be at a down level in order to provide an up level at node J; hence a NOR function.

Those skilled in the art will recoginize that the herein described improvements relate to Schottky transistor logic and will be able to incorporate the disclosed concepts into any desired logic configuration. While the invention has been shown and particularly described with reference to a preferred embodiment, it will be understood by those skilled in the art that various changes in form and detail may be made therein without departing from the spirit and scope of the invention.

What is claimed is:
1. An improved integrated circuit comprising:
first and second sources of potential;
a first plurality of series connected resistors and diodes connected in electrical parallel with each other and in electrical series with a first transistor having collector, base, and emitter regions, the collector region being connected to said first plurality of diodes, said base region being connected to a first input terminal, said emitter region being connected to said first source of potential, said first plurality of resistors being connected to said second source of potential;

a second plurality of series connected resistors and diodes connected in electrical parallel with each other and in electrical series with a second transistor have collector, base, and emitter regions, the collector region being connected to said second plurality of diodes, said base region being connected to a second input terminal, said emitter region being connected to said first source of potential, said second plurality of resistors being connected to said second source of potential;

a third plurality of series connected resistors and diodes connected in electrical parallel with each other and in electrical series with a third transistor having collector, base, and emitter regions, the collector region being connected to said third plurality of diodes, said emitter region being connected to said first source of potential, said third plurality of resistors being connected to said second source of potential;

an intermediate node formed by the common connection of one of said first plurality of diodes and one of said second plurality of diodes; and a metallurgical path having a finite resistance connecting said intermediate node to the base region of said third transistor such that base drive current for said third transistor proceeds in a current path from said second source of potential through one of said first or second plurality of resistors through said metallurgical path.

2. An improved integrated circuit as in claim 1 wherein said diodes are Schottky barrier diodes having relatively low forward voltage drops and comprising:
an additional Schottky barrier diode connected as a clamp between the collector region and the base region of said first transistor;
said additional Schottky barrier diode having a relatively high forward voltage drop.

3. An improved integrated circuit as in claim 2 further comprising:
an additional resistor connected between the collection region of said first transistor and said second source of potential.

4. An improved integrated circuit as in claim 3 wherein said second source of potential is at ground level, said first source of potential is at a negative voltage level, and said first, second, and third transistors are NPN transistors.

5. An improved integrated circuit as in claim 1 formed on an integrated circuit substrate comprising:
a plurality of metallurgical lines connected to each said first, second, and third plurality of diodes and also connected to certain ones of said first, second, and third plurality of series connected resistors;
one of said plurality of metallurgical paths being intentionally not connected to one of said series connected resistors of said first, second, or third plurality of series connected resistors.

6. An improved integrated circuit comprising:
first and second sources of potential;
a first plurality of series connected resistors and diodes connected in electrical parallel with each other and in electrical series with a first transistor having collector, base and emitter regions, the collector region being connected to said first plurality of diodes, said base region being connected to a first input terminal, said emitter region being connected to said first source of potential, said first plurality of resistors being connected to said second source of potential;
a metallurgical path having a finite resistance connecting at least one of said first plurality of diodes to the base region of a second transistor having collector, base, and emitter regions; and
one of said first plurality of series connected resistors forming a common node with said at least one of said first plurality of diodes providing base drive current to said second transistor.

7. An improved integrated circuit as in claim 6 wherein said diodes are Schottky barrier doides having relatively low forward voltage drops and comprising:
an additional Schottky barrier diode connected as a clamp between the collector region and the base region of said first transistor;
said additional Schottky barrier diode having a relatively high forward voltage drop.

8. An improved integrated circuit as in claim 7 further comprising:
an additional resistor connected between the collector region of said first transistor and said second source of potential.

9. An improved integrated circuit as in claim 8 wherein said second source of potential is at ground level, said first source of potential is at a negative voltage level, said first and second transistors are NPN transistors.